(12) United States Patent
Jin et al.

(10) Patent No.: US 11,647,587 B2
(45) Date of Patent: *May 9, 2023

(54) POWER MODULE STRUCTURE

(71) Applicant: Delta Electronics, Inc., Taoyuan (TW)

(72) Inventors: Da Jin, Taoyuan (TW); Kun Jiang, Taoyuan (TW); Junguo Cui, Taoyuan (TW); Yahong Xiong, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/714,493

(22) Filed: Apr. 6, 2022

(65) Prior Publication Data

US 2022/0232703 A1 Jul. 21, 2022

Related U.S. Application Data

(63) Continuation of application No. 17/168,030, filed on Feb. 4, 2021, now Pat. No. 11,330,717.

(30) Foreign Application Priority Data

| Feb. 27, 2020 | (CN) | ............... 202010123504.8 |
| Oct. 14, 2020 | (CN) | ............... 202011095568.8 |

(51) Int. Cl.
*H05K 1/14* (2006.01)
*H05K 1/11* (2006.01)
(Continued)

(52) U.S. Cl.
CPC .......... *H05K 1/145* (2013.01); *H01F 27/266* (2013.01); *H01F 27/2804* (2013.01);
(Continued)

(58) Field of Classification Search
CPC .... H05K 1/11; H05K 1/14; H05K 1/141–144; H05K 1/18;
(Continued)

(56) References Cited

U.S. PATENT DOCUMENTS

| 7,187,263 B2 * | 3/2007 | Vinciarelli .......... H01F 27/2804 336/200 |
| 8,531,841 B2 | 9/2013 | Lee |

(Continued)

FOREIGN PATENT DOCUMENTS

| CN | 101017730 A | 8/2007 |
| CN | 102360808 B | 7/2014 |

(Continued)

*Primary Examiner* — Tuan T Dinh
(74) *Attorney, Agent, or Firm* — Kirton McConkie; Evan R. Witt

(57) ABSTRACT

The present disclosure is related to a power module power structure and an assembling method thereof. The power module structure includes a first printed-circuit-board (PCB) assembly, a second PCB assembly, and a conductive connection component. The first PCB assembly includes a first circuit board, a power switch and a magnetic component. The first circuit board includes a first side, a second side and a through hole. The power switch is disposed on the first circuit board. The magnetic component includes a first magnetic core and a second magnetic core fastened on the first circuit board through the through hole. The second PCB assembly includes a second circuit board having a third side, a fourth side and at least one opening. The second magnetic core is exposed through the opening. The conductive connection component is disposed and electrically connected between the first PCB assembly and the second PCB assembly.

14 Claims, 13 Drawing Sheets

(51) Int. Cl.
*H05K 1/16* (2006.01)
*H01F 27/26* (2006.01)
*H01F 27/28* (2006.01)
*H01F 27/29* (2006.01)
*H01F 27/34* (2006.01)
*H05K 1/18* (2006.01)
*H05K 3/34* (2006.01)

(52) U.S. Cl.
CPC ............. *H01F 27/29* (2013.01); *H01F 27/34* (2013.01); *H05K 1/111* (2013.01); *H05K 1/144* (2013.01); *H05K 1/165* (2013.01); *H05K 1/181* (2013.01); *H05K 3/3494* (2013.01); *H05K 2201/086* (2013.01); *H05K 2201/10015* (2013.01); *H05K 2201/10053* (2013.01); *H05K 2201/10189* (2013.01); *H05K 2201/10734* (2013.01)

(58) Field of Classification Search
CPC .. H05K 1/181–187; H02M 7/00; H02M 7/06; H01F 27/24–34; H01F 27/2823; H01F 27/06; H01F 27/346
USPC ...... 361/767–790, 803; 336/65, 83, 191–200
See application file for complete search history.

(56) References Cited

U.S. PATENT DOCUMENTS

| | | | |
|---|---|---|---|
| 9,387,633 | B1 | 7/2016 | Vinciarelli et al. |
| 9,729,059 | B1 | 8/2017 | Parto |
| 10,062,499 | B2 | 8/2018 | Ji et al. |
| 11,201,560 | B2* | 12/2021 | Sakata ............... H02M 7/06 |
| 2003/0174037 | A1 | 9/2003 | Hooey et al. |
| 2005/0083665 | A1 | 4/2005 | Nakashima et al. |
| 2007/0152795 | A1 | 7/2007 | Zeng et al. |
| 2009/0085702 | A1 | 4/2009 | Zeng et al. |
| 2010/0164670 | A1 | 7/2010 | Nakahori et al. |
| 2011/0273257 | A1* | 11/2011 | Ishizawa ............ H01F 17/043 336/192 |
| 2015/0282370 | A1 | 10/2015 | Yang et al. |
| 2016/0128179 | A1* | 5/2016 | Okamoto .......... G01R 31/2801 29/832 |
| 2016/0268034 | A1* | 9/2016 | Subat ................ H01F 27/2804 |
| 2020/0113058 | A1 | 4/2020 | Xiong et al. |
| 2020/0113059 | A1 | 4/2020 | Xiong et al. |

FOREIGN PATENT DOCUMENTS

| | | |
|---|---|---|
| CN | 104205258 A | 12/2014 |
| CN | 103460309 B | 8/2016 |
| CN | 107077951 B | 5/2019 |
| CN | 111092536 A | 5/2020 |
| JP | 5998774 B2 | 9/2016 |

* cited by examiner

S01 — providing a first printed-circuit-board assembly including a first circuit board, at least one power switch and at least one magnetic component, wherein the first circuit board includes a first side, a second side and at least one through hole, the first side and the second side are opposite to each other, the at least one through hole passes through the first side and the second side, and the at least one power switch is disposed on the first circuit board, wherein the at least one magnetic component includes a first magnetic core and a second magnetic core.

S02 — providing a second printed-circuit-board assembly and a conductive connection component, wherein the second printed-circuit-board assembly includes a second circuit board, wherein the second circuit board includes a third side, a fourth side and at least one hollow slot, the third side and the fourth side are opposite to each other, and the at least one hollow slot passes through the third side and the fourth side, wherein the conductive connection component is disposed on the third side.

S03 — stacking the second printed-circuit-board assembly and the at least one conductive connection component on the second side of the first circuit board, wherein the second side of the first circuit board faces the third side, the second magnetic core of the at least one magnetic component spatially corresponds to the at least one hollow slot, and the second magnetic core of the at least one magnetic component is exposed through the at least one hollow slot.

S04 — connecting the at least one conductive connection compoent and the first printed-circuit-board assembly through a reflow soldering process.

S05 — pushing against the second magnetic core through the at least one hollow slot, and connecting the first magnetic core and the second magnetic core through the at least one through hole, so that the first magnetic core and the second magnetic core are disposed on the first side and the second side, respectively, and combined on the first circuit board.

FIG. 13

POWER MODULE STRUCTURE

CROSS-REFERENCE TO RELATED APPLICATION

This application is a Continuation Application of U.S. patent application Ser. No. 17/168,030 filed on Feb. 4, 2021, and entitled "POWER MODULE STRUCTURE AND ASSEMBLING METHOD THEREOF", which claims priorities to China Patent Application No. 202010123504.8, filed on Feb. 27, 2020 and China Patent Application No. 202011095568.8, filed on Oct. 14, 2020. The entire contents of the above-mentioned patent applications are incorporated herein by reference for all purposes.

FIELD OF THE INVENTION

The present disclosure relates to a power module, and more particularly to a power module structure and an assembling method thereof to reduce the number of reflow soldering processes undergone by the assembled components.

BACKGROUND OF THE INVENTION

In recent years, an onboard high-power DC/DC power module has been widely used in fields such as telephone communications, data centers, and supercomputers. With the rapid development of fixed-line networks, mobile communications and artificial intelligence, the requirements for the output power and efficiency of the onboard high-power DC/DC power module are getting higher and higher. On the other hand, as communication products tend to miniaturization, the size of the power module has to be further reduced to increase the power density while improving efficiency.

In order to significantly reduce the size and the weight of the power module and increase the power density of the power module, the current power module on the market utilizes a planar transformer technology and a double-PCB-welding-assembly technology. The power module includes a power-board assembly and a pin-board assembly. The power-board assembly needs to go through two surface-mounting reflow soldering processes first to mount the power device on the power-board assembly, and then the power-board assembly is assembled with the magnetic component. The upper magnetic core of the magnetic component is attached to a top side of the power-board body, and the lower magnetic core of the magnetic component is bonded therewith, so that the assembly of the power-board assembly and a planar transformer is achieved. After that, the power-board assembly is placed on the pin-board with the components on the pin-board, and then a third reflow soldering process is performed to obtain the power module. In other words, in the conventional power module structure, fine components such as power devices on the power-board assembly need to undergo more than three reflow soldering processes to complete the assembly. Consequently, a long manufacturing time and high cost are required. The risk of damage of the fine components during the manufacturing process is increased. In addition, the power-board assembly, the magnetic component and the pin-board assembly are assembled in sequence, the assembling process has poor modulability, and the height of the overall structure cannot be further reduced to achieve the purpose of increasing the power density.

Therefore, there is a need to provide a power module structure and an assembling method thereof to address the above issues encountered by the prior arts.

SUMMARY OF THE INVENTION

An object of the present disclosure provides a power module structure and an assembling method thereof. A first printed-circuit-board assembly such as a power-board assembly and a second printed-circuit-board assembly such as a pin-board assembly are assembled through at least one conductive connection component and completed by one reflow soldering process, to reduce the number of reflow soldering processes undergone by a fine component such as a power device on the power-board assembly. Moreover, the purposes of simplifying the manufacturing process and reducing production costs are achieved at the same time.

Another objection of the present disclosure provides a power module structure and an assembling method thereof. A first printed-circuit-board assembly such as a power-board assembly and a second printed-circuit-board assembly such as a pin-board assembly are assembled through at least one conductive connection component and completed by one reflow soldering process. A pin board of the pin-board assembly includes at least one hollow slot disposed thereon. The at least one hollow slot spatially corresponds to a magnetic component including an upper magnetic core and a lower magnetic core, and the conductive connection component and the magnetic component are misaligned. Moreover, the projections of the magnetic component and the hollow slot are at least partially overlapped on a plane of the pin board, so as to expose a bottom surface of the lower magnetic core through the hollow slot. Thus, the magnetic component arranged on the power-board assembly is passed through the hollow slot of the pin board after one reflow soldering process, and a tool is used to push the lower magnetic core of the magnetic component through the hollow slot to complete the assembly of the magnetic component fixed to the power-board assembly. It is helpful of increasing the flexibility of the assembly process. In addition, a portion of the lower magnetic core of the magnetic component is received within the hollow slot, so as to reduce the height of the overall structure and achieve the purpose of increasing power density.

In accordance with an aspect of the present disclosure, a power module structure is provided. The power module structure includes a first printed-circuit-board assembly, a second printed-circuit-board assembly and at least one conductive connection component. The first printed-circuit-board assembly includes a first circuit board, at least one power switch and at least one magnetic component. The first circuit board includes a first side, a second side and at least one through hole. The first side and the second side are opposite to each other. The at least one through hole passes through the first side and the second side. The at least one power switch is disposed on the first circuit board. The at least one magnetic component includes a first magnetic core and a second magnetic core disposed on the first side and the second side, respectively, and combined on the first circuit board through the at least one through hole. The second printed-circuit-board assembly includes a second circuit board. The second circuit board includes a third side, a fourth side and at least one hollow slot. The third side and the fourth side are opposite to each other. The third side faces the second side. The at least one hollow slot passes through the third side and the fourth side, and spatially corresponds to the second magnetic core of the at least one magnetic component. The second magnetic core of the at least one magnetic component is exposed through the at least one hollow slot. The conductive connection component is disposed on the second side of the first circuit board and the third side of the second circuit board, and electrically connected to the first printed-circuit-board assembly and the second printed-circuit-board assembly. The at least one conductive connection component and the at least one magnetic component are misaligned to each other.

In an embodiment, the at least one conductive connection component is connected between the first printed-circuit-board assembly and the second printed-circuit-board assembly through a reflow soldering process.

In an embodiment, a projection area of the at least one hollow slot projected on the third side and a projection area of the second magnetic core of the at least one magnetic component projected on the third side are at least partially overlapped.

In an embodiment, a projection area of the at least one hollow slot projected on the third side is greater than 0.2 $mm^2$.

In an embodiment, the at least one hollow slot includes a stepped structure and has an accommodation region, and the accommodation region is concavely formed from the third side toward the fourth side. A projection area of the accommodation region projected on the third side is greater than a projection area of the second magnetic core of the at least one magnetic component projected on the third side. The second magnetic core of the at least one magnetic component is at least partially accommodated in the accommodation region.

In an embodiment, the at least one hollow slot passes through the second printed-circuit-board assembly, and a projection area of the at least one hollow slot projected on the third side is greater than a projection area of the second magnetic core of the at least one magnetic component projected on the third side, and the second magnetic core of the at least one magnetic component is at least partially accommodated in the at least one hollow slot.

In an embodiment, the at least one conductive connection component is one selected from the group consisting of a copper block and a pin header.

In an embodiment, the at least one conductive connection component is made of a material selected from the group consisting of aluminum, copper and copper alloy.

In an embodiment, the at least one magnetic component is a planar transformer.

In an embodiment, the second circuit board includes at least one pin disposed on the fourth side and used for external electrical connection.

In an embodiment, the at least one pin is one selected from the group consisting of a land grid array pin and a ball grid array pin.

In an embodiment, the first printed-circuit-board assembly includes at least one driving chip disposed on the first side or the second side of the first circuit board.

In an embodiment, the second printed-circuit-board assembly includes at least one controlling chip disposed on the third side of the second circuit board.

In an embodiment, the at least one hollow slot is used for operating a tool to assemble the magnetic component.

In an embodiment, the at least one hollow slot has a shape selected from the group consisting of a circle, a rectangle, a square and an ellipse.

In accordance with an aspect of the present disclosure, an assembling method of a power module structure is provided. The assembling method includes: (a) providing a first printed-circuit-board assembly including a first circuit board, at least one power switch and at least one magnetic component, wherein the first circuit board includes a first side, a second side and at least one through hole, the first side and the second side are opposite to each other, the at least one through hole passes through the first side and the second side, and the at least one power switch is disposed on the first circuit board, wherein the at least one magnetic component includes a first magnetic core and a second magnetic core; (b) providing a second printed-circuit-board assembly and a conductive connection component, wherein the second printed-circuit-board assembly includes a second circuit board, wherein the second circuit board includes a third side, a fourth side and at least one hollow slot, the third side and the fourth side are opposite to each other, and the at least one hollow slot passes through the third side and the fourth side, wherein the conductive connection component is disposed on the third side; (c) stacking the second printed-circuit-board assembly and the at least one conductive connection component on the second side of the first circuit board, wherein the second side of the first circuit board faces the third side, the second magnetic core of the at least one magnetic component spatially corresponds to the at least one hollow slot, and the second magnetic core of the at least one magnetic component is exposed through the at least one hollow slot; (d) connecting the at least one conductive connection component and the first printed-circuit-board assembly through a reflow soldering process; and (e) pushing against the second magnetic core through the at least one hollow slot, and connecting the first magnetic core and the second magnetic core through the at least one through hole, so that the first magnetic core and the second magnetic core are disposed on the first side and the second side, respectively, and combined on the first circuit board.

In an embodiment, the step (a) further includes a step of (a0) disposing the at least one power switch on the first circuit board through through a reflow soldering process, and the step (b) further includes a step of (b0) disposing the at least one conductive connection component on the third side through a reflow soldering process.

In an embodiment, the step (c) further includes a step of (c1) pre-placing the second magnetic core between the first circuit board and the second circuit board.

In an embodiment, the at least one hollow slot passes through the second circuit board, and a projection area of the at least one hollow slot projected on the third side and a projection area of the second magnetic core of the at least one magnetic component projected on the third side are at least partially overlapped.

In an embodiment, a projection area of the at least one hollow slot projected on the third side is greater than 0.2 $mm^2$.

In an embodiment, the at least one hollow slot includes a stepped structure and has an accommodation region, and the accommodation region is concavely formed from the third side toward the fourth side, wherein a projection area of the accommodation region projected on the third side is greater than a projection area of the second magnetic core of the at least one magnetic component projected on the third side, and the second magnetic core of the at least one magnetic component is at least partially accommodated in the accommodation region.

In an embodiment, the at least one conductive connection component is one selected from the group consisting of a copper block and a pin header.

In an embodiment, the at least one magnetic component is a planar transformer.

In an embodiment, the at least one hollow slot has a shape selected from the group consisting of a circle, a rectangle, a square and an ellipse.

BRIEF DESCRIPTION OF THE DRAWINGS

FIG. 13 is a flow chart showing an assembling method of a power module structure according to an embodiment of the present disclosure.

DETAILED DESCRIPTION OF THE PREFERRED EMBODIMENT

The present disclosure will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
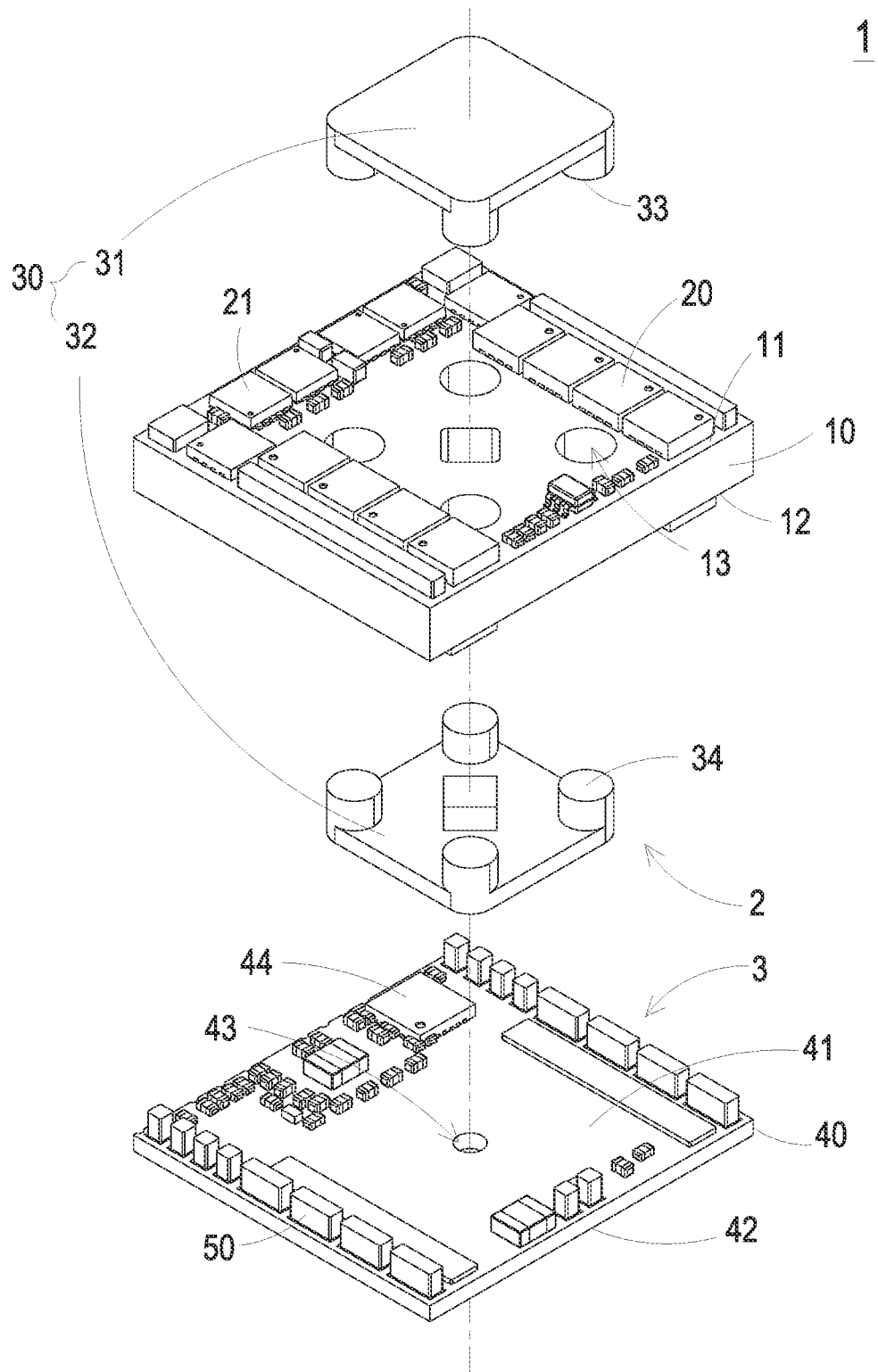
FIG. 1 is an exploded view illustrating a power module structure according to a first embodiment of the present disclosure.
Figure 2:
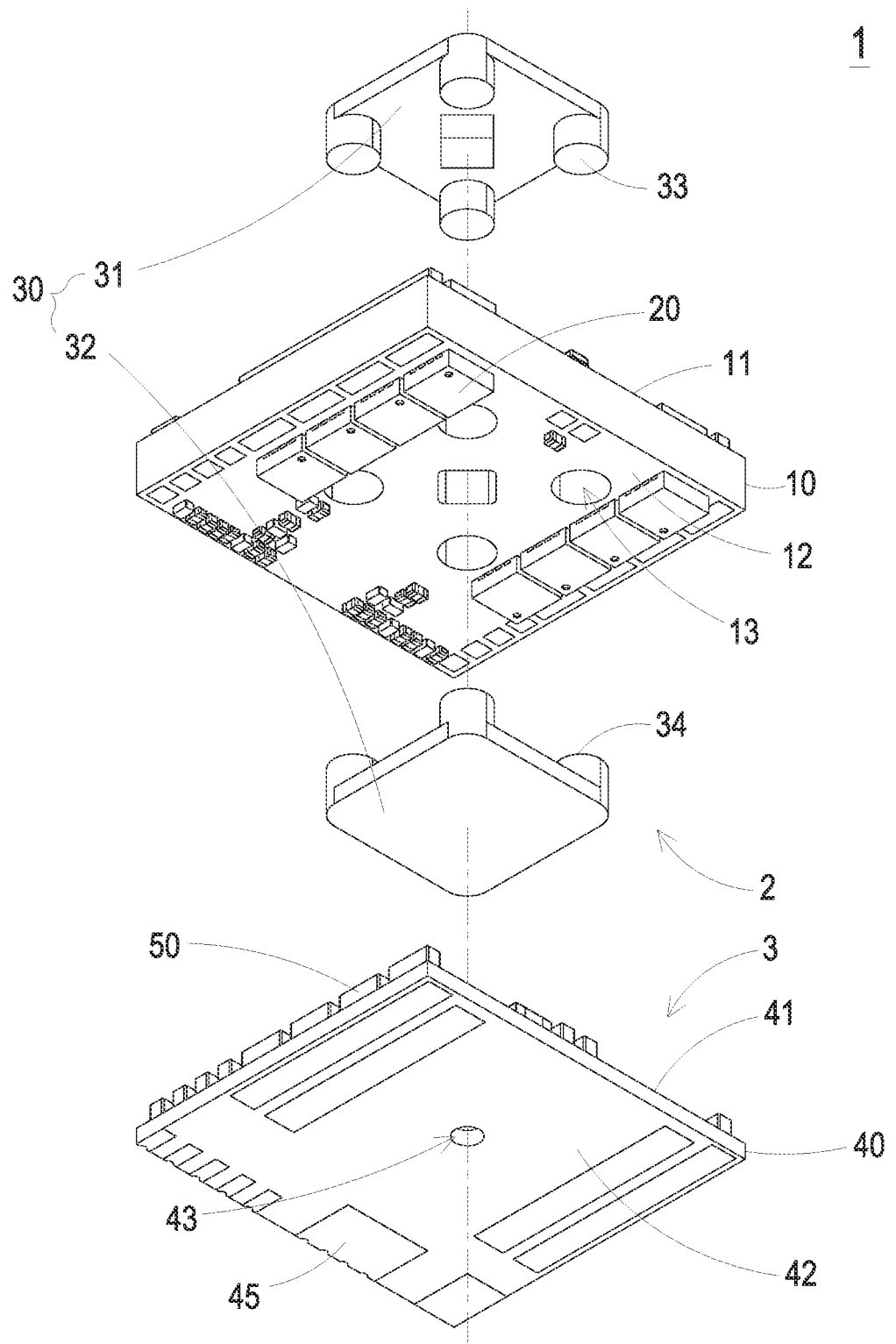
FIG. 2 is an exploded view illustrating the power module structure according to the first embodiment of the present disclosure and taken from another perspective.
Figure 3:
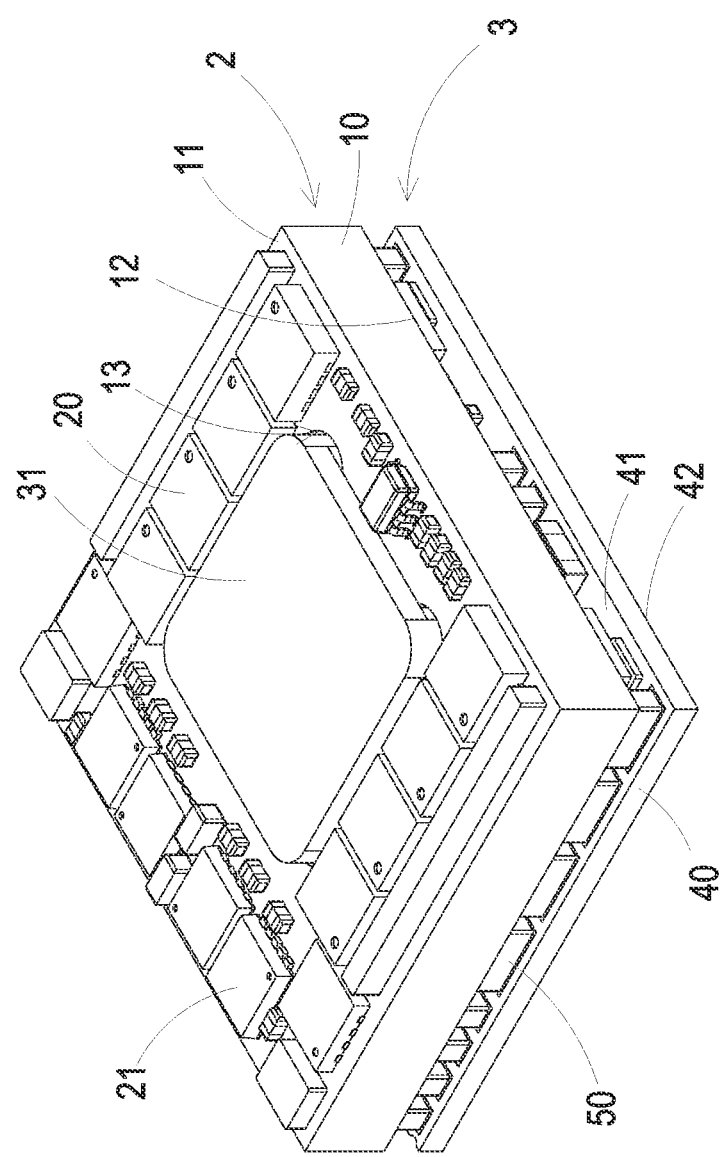
FIG. 3 is a perspective view illustrating the power module structure according to the first embodiment of the present disclosure.
Figure 4:
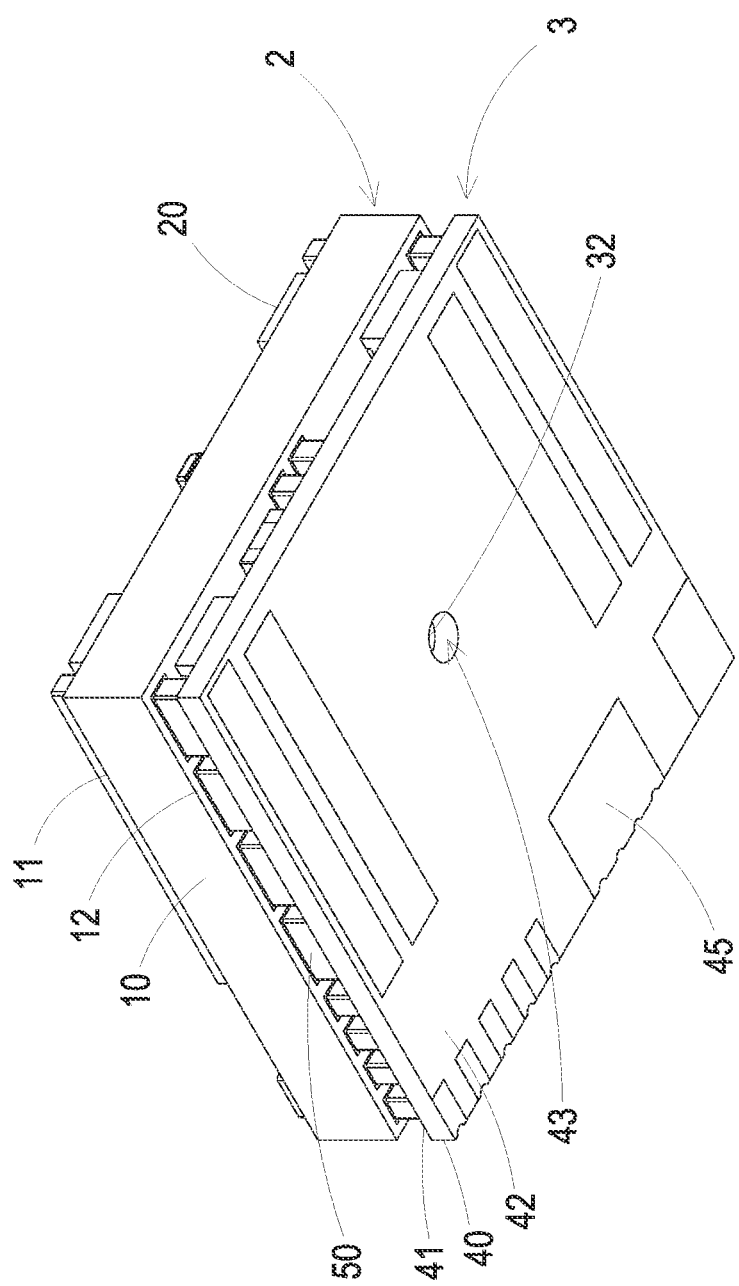
FIG. 4 is a perspective view illustrating the power module structure according to the first embodiment of the present disclosure and taken from another perspective.

FIG. 1 and FIG. 2 are exploded views illustrating a power module structure according to a first embodiment of the present disclosure. FIG. 3 and FIG. 4 are perspective views illustrating the power module structure according to the first embodiment of the present disclosure. In the embodiment, the power module structure 1 includes a first printed-circuit-board assembly 2, a second printed-circuit-board assembly 3 and at least one conductive connection component 50. Preferably but not exclusively, the first printed-circuit-board assembly 2 is a power-board assembly and the second printed-circuit-board assembly 3 is a pin-board assembly. Preferably but not exclusively, the at least one conductive connection component 50 is a copper block or a pin header. The first printed-circuit-board assembly 2, the second printed-circuit-board assembly 3 and the at least one conductive connection component 50 are assembled through one reflow soldering process.

In the embodiment, the first printed-circuit-board assembly 2 includes a first circuit board 10, at least one power switch 20 and at least one magnetic component 30. The first circuit board 10 includes a first side 11, a second side 12 and at least one through hole 13. The at least one through hole 13 passes through the first side 11 and the second side 12. The at least one power switch 20 is disposed on the first circuit board 10. Preferably but not exclusively, in the embodiment, the first printed-circuit-board assembly 2 further includes a plurality of power switch 20 disposed on the first side 11 and the second side 12 of the first circuit board 10. Preferably but not exclusively, in other embodiments, the at least one power switch 20 is disposed on the first side 11 or the second side 12 of the first circuit board 10. The present disclosure is not limited thereto.

In the embodiment, the at least one magnetic component 30 includes a first magnetic core 31 and a second magnetic core 32. Preferably but not exclusively, the first magnetic core 31 and the second magnetic core 32 are an upper magnetic core and a lower magnetic core cooperated with each other, disposed on the first side 11 and the second side 12 of the first circuit board 10, respectively, and combined on the first circuit board 10 through the at least one through hole 13. Preferably but not exclusively, the magnetic component 30 is a planar transformer, further includes a planar winding (not shown) disposed on the first circuit board 10. The planar winding, the first magnetic core 31 and the second magnetic core 32 are cooperated to form the planar transformer. In other embodiments, when a magnetic leg 33 of the first magnetic core 31 and a magnetic leg 34 of the second magnetic core 32 are connected by passing through the at least one through hole 13, at least one air gap (not shown) is formed therebetween according to the practical requirements. In that, the performance of the at least one magnetic component 30 is modulated. Certainly, the present disclosure is not limited thereto.

In the embodiment, the second printed-circuit-board assembly 3 includes a second circuit board 40. The second circuit board 40 includes a third side 41, a fourth side 42 and at least one hollow slot 43. The third side 41 of the second circuit board 40 faces the second side 12 of the first circuit board 10. In the embodiment, the at least one hollow slot 43 passes through the third side 41 and the fourth side 42, and spatially corresponds to the second magnetic core 32 of the at least one magnetic component 30. Furthermore, the second magnetic core 32 of the at least one magnetic component 30 is exposed through the at least one hollow slot 43. Preferably but not exclusively, the at least one hollow slot 43 has a shape selected from the group consisting of a circle, a rectangle, a square and an ellipse. The present disclosure is not limited thereto.

In the embodiment, the conductive connection component 50 is disposed between the second side 12 of the first circuit board 10 and the third side 41 of the second circuit board 40, and electrically connected between the first printed-circuit-board assembly 2 and the second printed-circuit-board assembly 3. Moreover, the at least one conductive connection component 50 and the at least one magnetic component 30 are misaligned to each other. Thereby, the first printed-circuit-board assembly 2 such as a power-board assembly and the second printed-circuit-board assembly 3 such as a pin-board assembly are assembled through the at least one conductive connection component 50 and completed by one reflow soldering process, to reduce the number of reflow soldering processes undergone by the fine component such as the at least one power switch 20 on the first printed-circuit-board assembly 2. Thus, the purposes of simplifying the manufacturing process and reducing production costs are achieved at the same time.

Notably, in the embodiment, the at least one power switch 20 of the first printed-circuit-board assembly 2 is preset on the first circuit board 10 by one reflow soldering process. Thereafter, when the first printed-circuit-board assembly 2 and the second printed-circuit-board assembly 3 are connected through the at least one conductive connection component 50 by another reflow soldering process, the at least one power switch 20 of the first printed-circuit-board assembly 2 undergoes twice reflow soldering processes. On the other hand, a projection area of the at least one magnetic component 30 projected on the third side 41 of the second circuit board 40 and a projection area of the at least one hollow slot 43 projected on the third side 41 of the second circuit board 40 are at least partially overlapped. Furthermore, the bottom of the second magnetic core 32 is exposed through the at least one hollow slot 43. Preferably but not exclusively, the projection area of the at least one hollow slot 43 projected on the third side 41 is greater than 0.2 mm$^2$. In that, it facilitates a tool to pass through the at least one hollow slot 43 to push against the exposed bottom of the second magnetic core 32 of the magnetic component 30. Thereby, the second magnetic core 32 pre-mounted between the first circuit board 10 and the second circuit board 40 is exposed through the at least one hollow slot 43 after the reflow soldering process described above, and a tool is used to push the exposed bottom of the second magnetic core 32 of the magnetic component 30 through the at least one hollow slot 43, so as to complete the assembly of the magnetic component 30 fixed on the first circuit board 10. It is helpful of increasing the flexibility of the assembly process.

Moreover, in the embodiment, the first printed-circuit-board assembly 2 includes at least one driving chip 21 disposed on the first side 11 or the second side 12 of the first circuit board 10. Preferably but not exclusively, the at least one driving chip 21 and the at least one power switch 20 are preset on the first circuit board 10 by one reflow soldering process. Certainly, the present disclosure is not limited thereto. Moreover, in the embodiment, the second printed-circuit-board assembly 3 includes at least one controlling chip 44 disposed on the third side 41 of the second circuit board 40. Preferably but not exclusively, the at least one controlling chip 44 and the at least one conductive connection component 50 are pre-mounted on the third side 41 of the second circuit board 40. The at least one controlling chip 44, the first printed-circuit-board assembly 2, at least one conductive connection component 50 and the second circuit board 40 undergo another reflow soldering process, so that the at least one controlling chip 44, the printed-circuit-board assembly 2 and the at least one conductive connection component 50 disposed on the third side 41 of the second circuit 40 are achieved. The present disclosure is not limited thereto. In addition, the second circuit board 40 includes at least one pin 45 disposed on the fourth side 42 and used for external electrical connection with for example but not limited to a system end or a system motherboard. In other words, the at least one pin 45 is used as an input/output and control port of the power module 1, which is connected to the system end or system motherboard externally. Preferably but not exclusively, the at least one pin 45 is a land grid array (LGA) pin or a ball grid array (BGA) pin. The present disclosure is not limited thereto.

Figure 5:
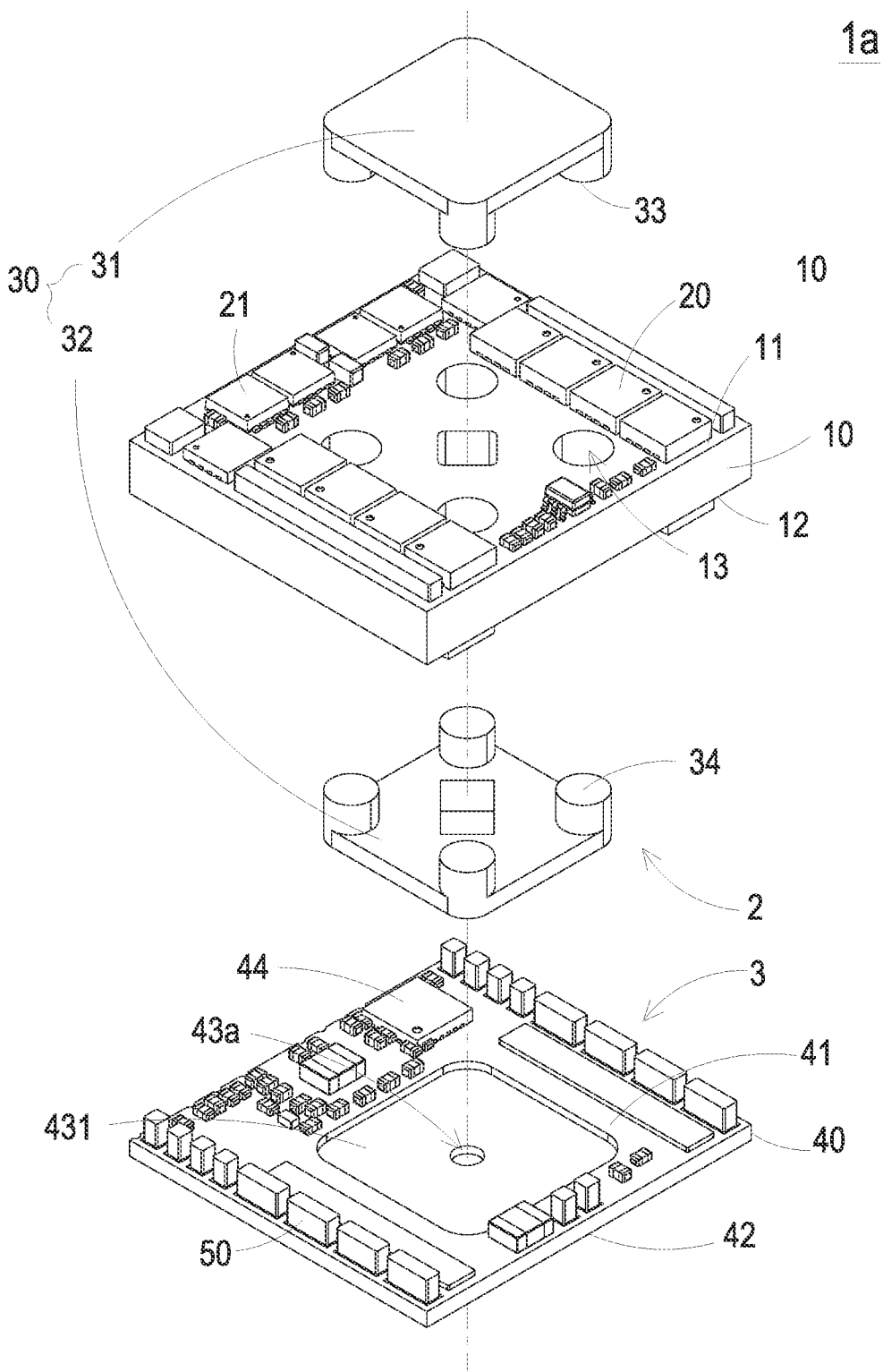
FIG. 5 is an exploded view illustrating a power module structure according to a second embodiment of the present disclosure.
Figure 6:
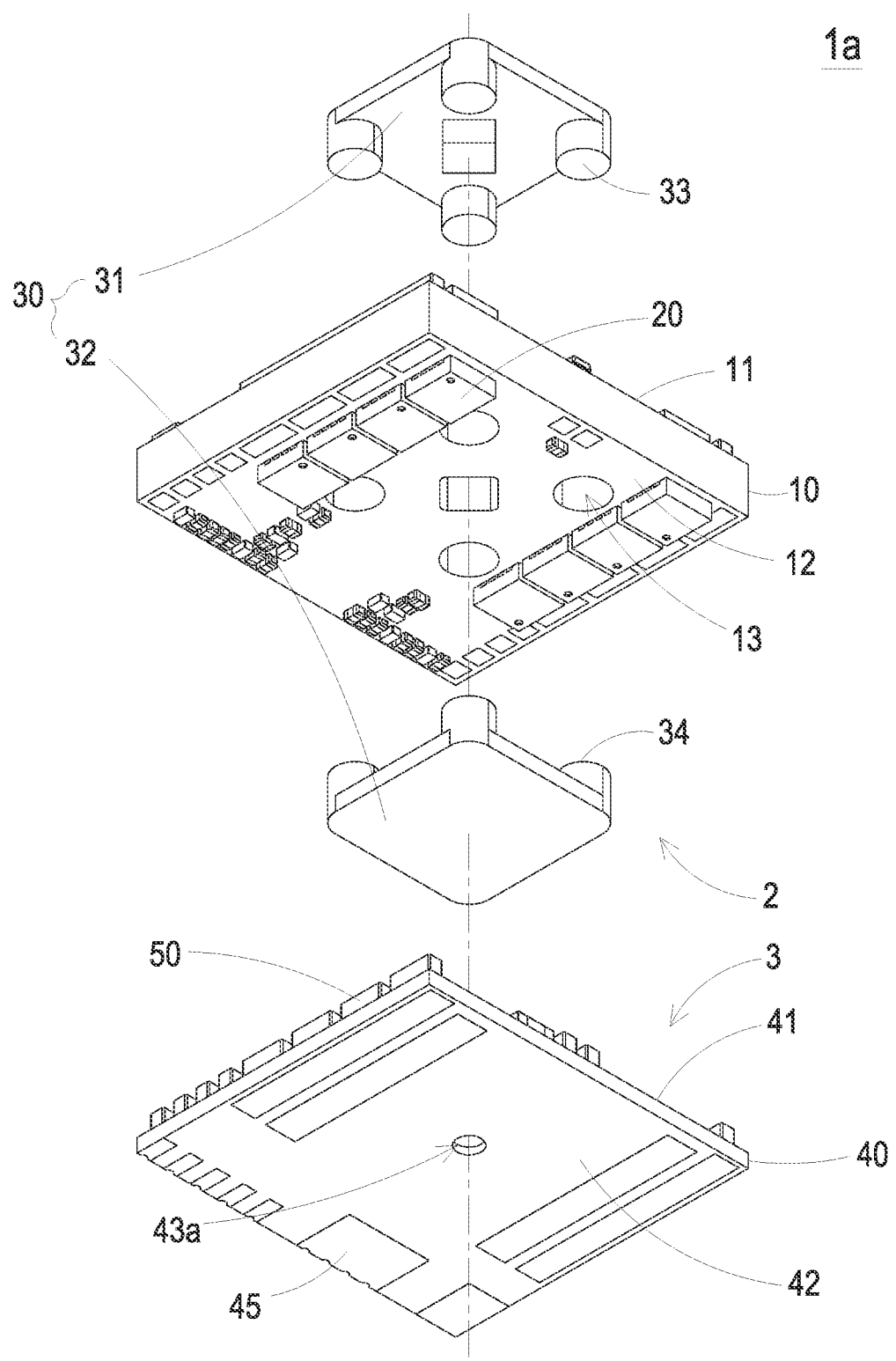
FIG. 6 is an exploded view illustrating the power module structure according to the second embodiment of the present disclosure and taken from another perspective.
Figure 7:
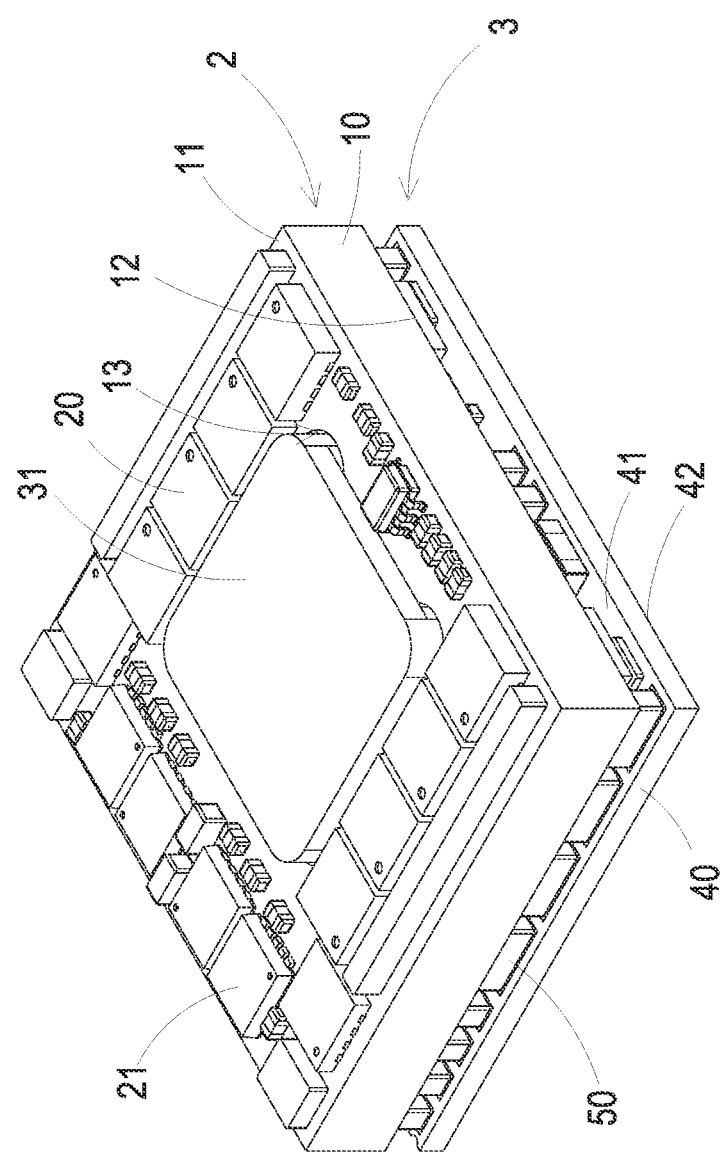
FIG. 7 is a perspective view illustrating the power module structure according to the second embodiment of the present disclosure.
Figure 8:
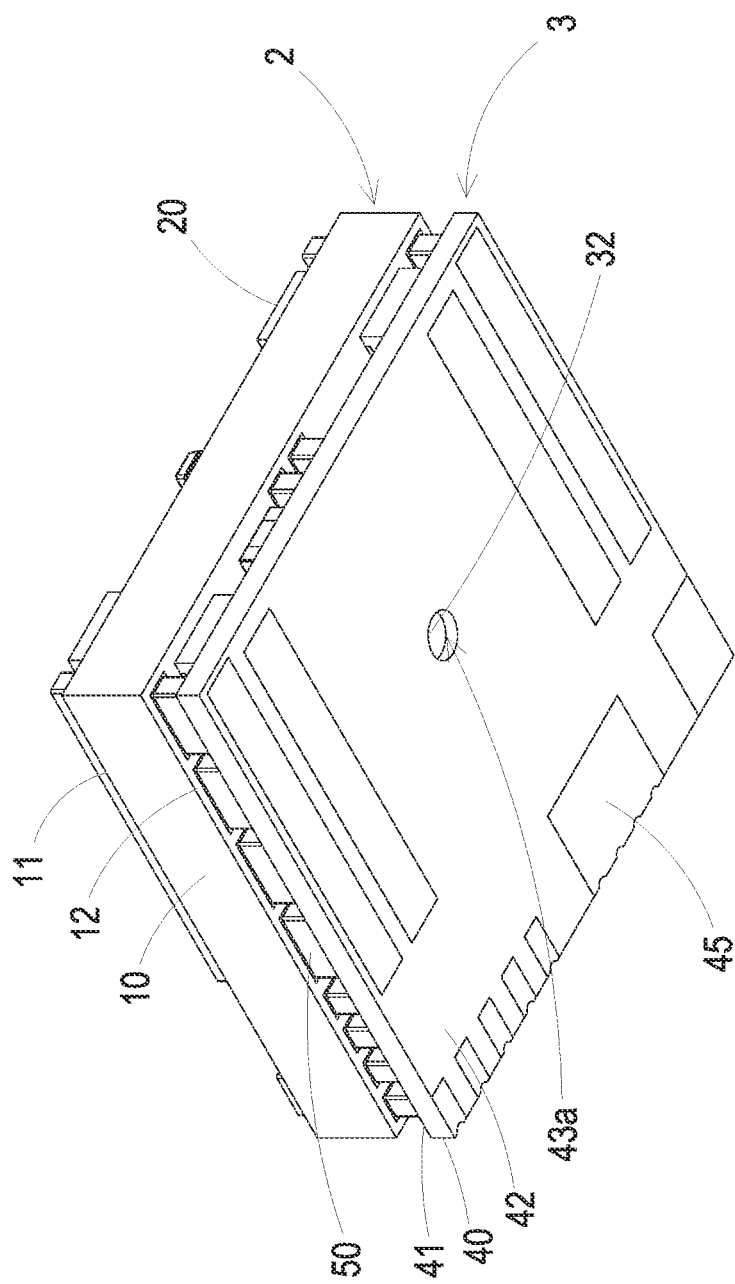
FIG. 8 is a perspective view illustrating the power module structure according to the second embodiment of the present disclosure and taken from another perspective.

FIG. 5 and FIG. 6 are exploded views illustrating a power module structure according to a second embodiment of the present disclosure. FIG. 7 and FIG. 8 are perspective views illustrating the power module structure according to the second embodiment of the present disclosure. In the embodiment, the power module structure 1*a* is similar to the power module structure 1 shown in FIGS. 1 to 4, and the same labels of the components represent the same components, structures and functions, not redundantly described herein. In the embodiment, the first printed-circuit-board assembly 2, the second printed-circuit-board assembly 3 and the at least one conductive connection component 50 of the power module structure 1*a* are assembled through one reflow soldering process. The number of reflow soldering processes undergone by a fine component such as the power switch 20 is reduced. Moreover, the purposes of simplifying the manufacturing process and reducing production costs are achieved at the same time. After the reflow soldering process, the magnetic component 30 is combined on the first circuit board 10. In the embodiment, the at least one hollow slot 43*a* includes a stepped structure and further has an accommodation region 431. The accommodation region 431 is concavely formed from the third side 41 toward the fourth side 42. Moreover, a projection area of the accommodation region 431 projected on the third side 41 is greater than a projection area of the second magnetic core 32 of the at least one magnetic component 30 projected on the third side 41. The second magnetic core 32 of the at least one magnetic component 30 is at least partially accommodated in the accommodation region 431. In other words, the hollow slot 43*a* provides a tool for passing through to complete the assembly of the magnetic component 30 and the first circuit board 10, and a portion of the second magnetic core 32 of the magnetic component 30 is received within the hollow slot 43*a*, so as to reduce the height of the overall power module structure 1*a* and achieve the purpose of increasing power density.

Figure 9:
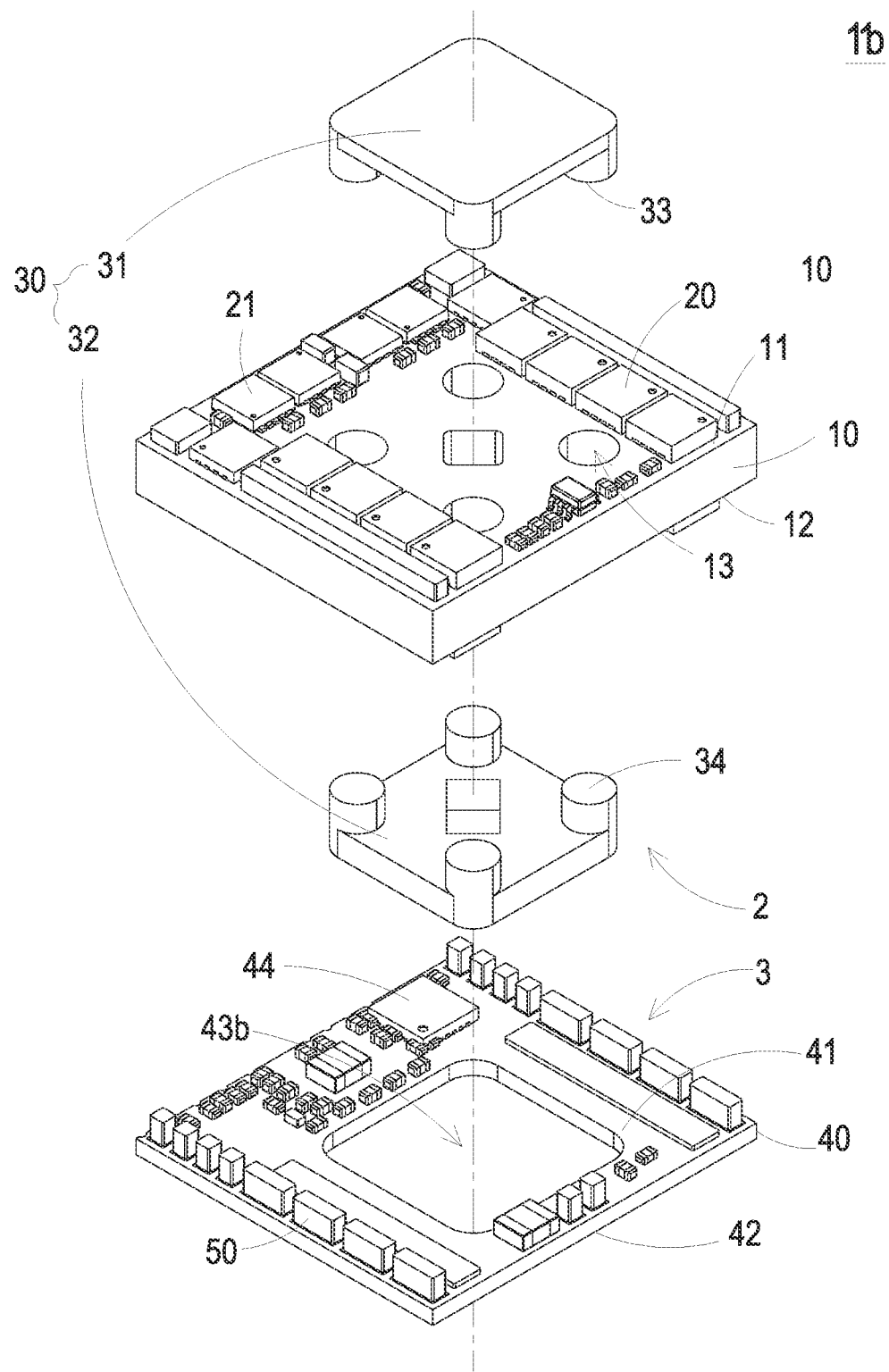
FIG. 9 is an exploded view illustrating a power module structure according to a third embodiment of the present disclosure.
Figure 10:
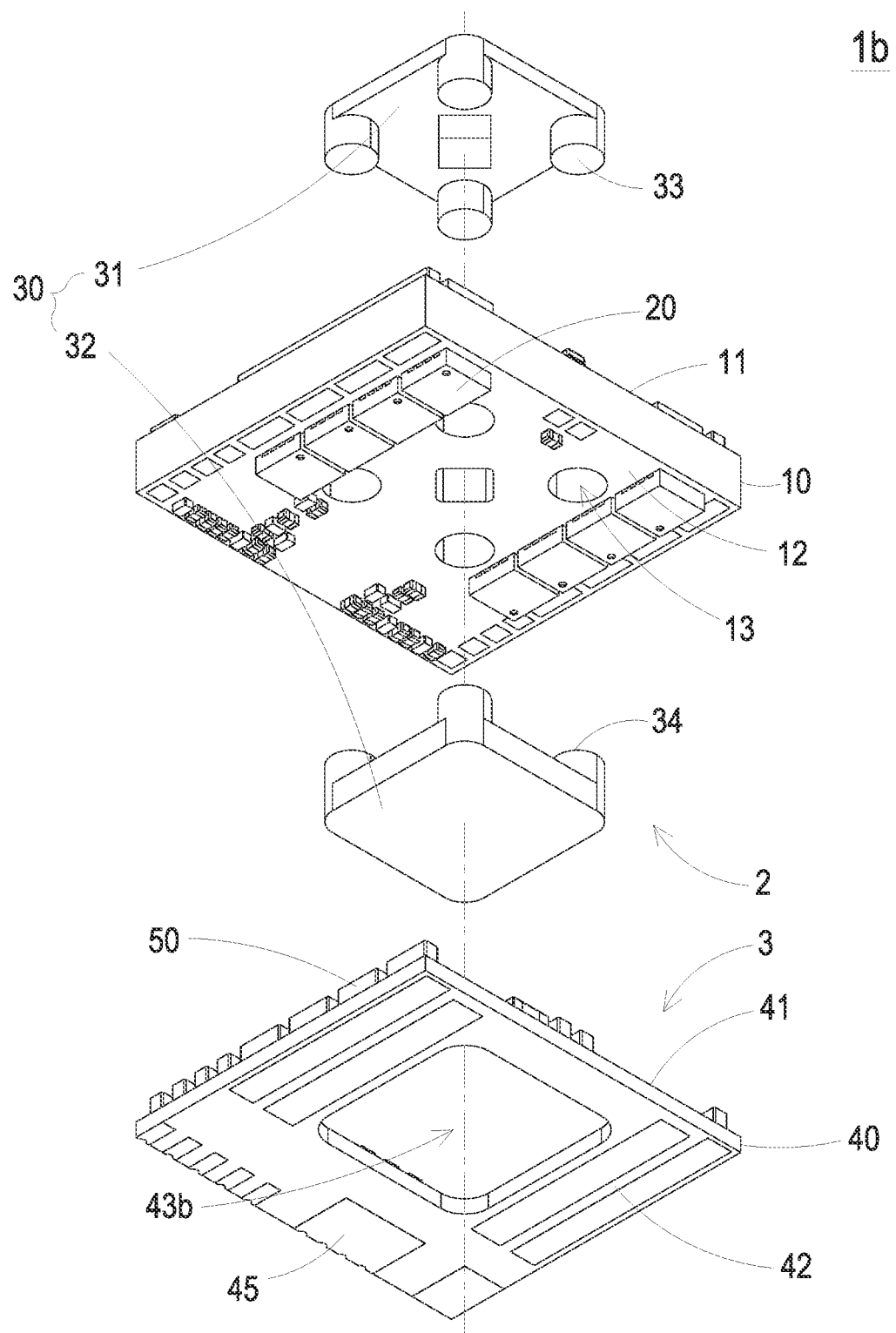
FIG. 10 is an exploded view illustrating the power module structure according to the third embodiment of the present disclosure and taken from another perspective.
Figure 11:
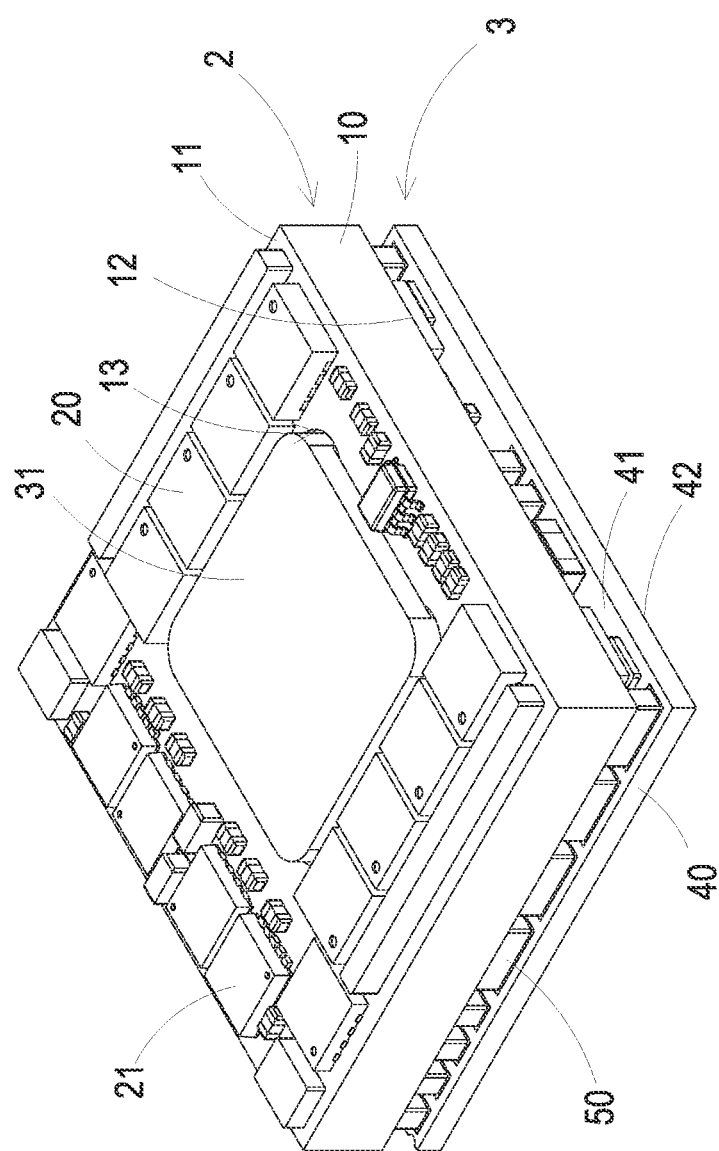
FIG. 11 is a perspective view illustrating the power module structure according to the third embodiment of the present disclosure.
Figure 12:
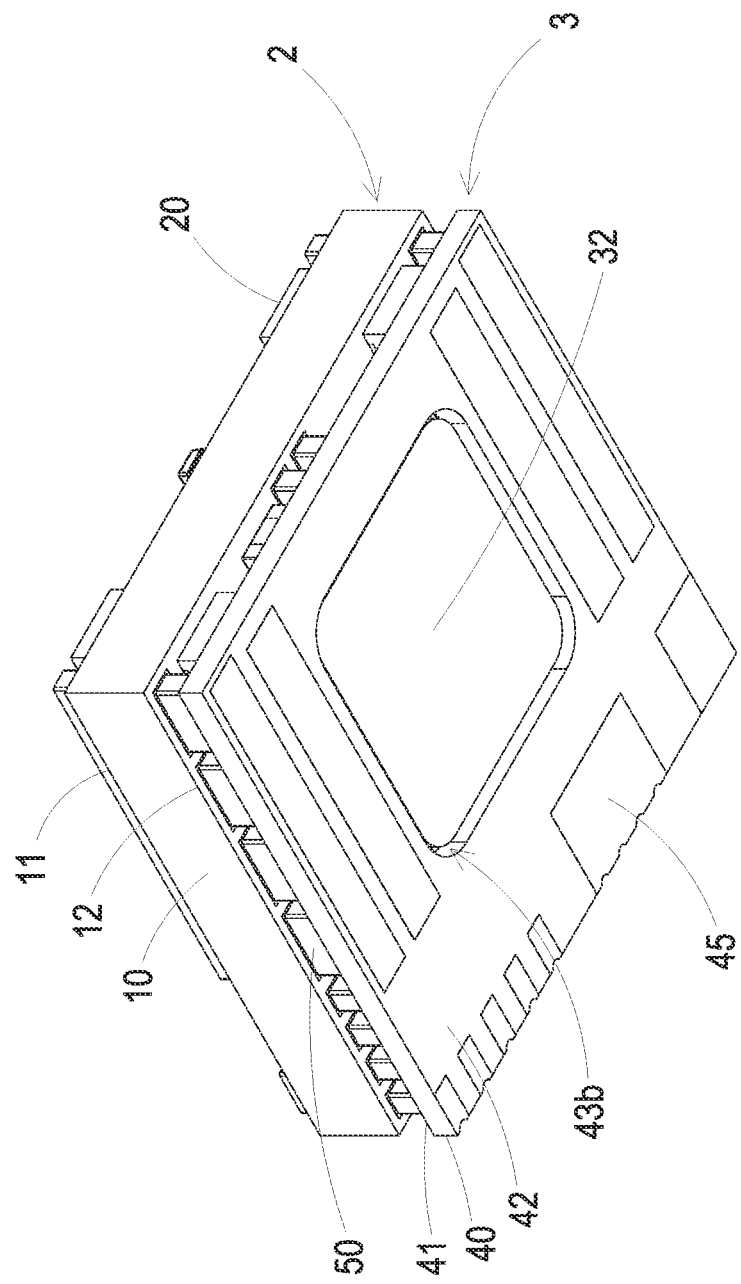
FIG. 12 is a perspective view illustrating the power module structure according to the third embodiment of the present disclosure and taken from another perspective.

FIG. 9 and FIG. 10 are exploded views illustrating a power module structure according to a third embodiment of the present disclosure. FIG. 11 and FIG. 12 are perspective views illustrating the power module structure according to the third embodiment of the present disclosure. In the embodiment, the power module structure 1*b* is similar to the power module structure 1 shown in FIGS. 1 to 4, and the same labels of the components represent the same components, structures and functions, not redundantly described herein. In the embodiment, the first printed-circuit-board assembly 2, the second printed-circuit-board assembly 3 and the at least one conductive connection component 50 of the power module structure 1*b* are assembled through one reflow soldering process. The number of reflow soldering processes undergone by a fine component such as the power switch 20 is reduced. Moreover, the purposes of simplifying the manufacturing process and reducing production costs are achieved at the same time. After the reflow soldering process, the magnetic component 30 is combined on the first circuit board 10. In the embodiment, the at least one hollow slot 43*b* passes through the second printed-circuit-board assembly 3, and a projection area of the at least one hollow slot 43*b* projected on the third side 41 is greater than a projection area of the second magnetic core 32 of the at least one magnetic component 30 projected on the third side 41, and the second magnetic core 32 of the at least one magnetic component 30 is at least partially accommodated in the at least one hollow slot 43b. Thereby, the hollow slot 43b is used for allowing the second magnetic core 32 to pass through so as to complete the assembly of the magnetic component 30 and the first circuit board 10, and a portion of the second magnetic core 32 of the magnetic component 30 is received within the hollow slot 43b, so as to reduce the height of the overall power module structure 1b and achieve the purpose of increasing power density.

On the other hand, in response to the power module structure in the aforementioned embodiments, the present disclosure also provides an assembling method of a power module structure. FIG. 13 is a flow chart showing an assembling method of a power module structure according to an embodiment of the present disclosure. Please refer to FIGS. 1 to 4 and FIG. 13. Firstly, as shown in the step S01, the first printed-circuit-board assembly 2 of the foregoing embodiment is provided. The first printed-circuit-board assembly 2 includes a first circuit board 10, at least one power switch 20 and at least one magnetic component 30. The first circuit board 10 includes a first side 11, a second side 12 and at least one through hole 13. The first side 11 and the second side 12 are opposite to each other. The at least one through hole 13 passes through the first side 11 and the second side 12. In the embodiment, the power switch 20 and the other devices such as the driving chip 21 of the first circuit board 10 undergo a reflow soldering process, so as to preset the power switch 20 and the driving chip 21 on the first side 11 of the first circuit board 10. In the embodiment, the magnetic component 30 includes a first magnetic core 31 and a second magnetic core 32. Preferably but not exclusively, the first magnetic core 31 and the second magnetic core 32 are an upper magnetic and a lower magnetic core cooperated with each other. In the embodiment, the first magnetic core 31 and the second magnetic core 32 are combined and connected after another subsequent reflow soldering process.

Then, as shown in the step S02, the second printed-circuit-board assembly 3 and at least one conductive connection component 50 are provided. In the embodiment, the second printed-circuit-board assembly 3 includes a second circuit board 40. The second circuit board 40 includes a third side 41, a fourth side 42 and at least one hollow slot 43. The third side 41 and the fourth side 42 are opposite to each other. The at least one hollow slot 43 passes through the third side 41 and the fourth side 42. Preferably but not exclusively, the at least one hollow slot 43 has a shape selected from the group consisting of a circle, a rectangle, a square and an ellipse. The present disclosure is not limited thereto. In an embodiment, the at least one hollow slot 43a includes a stepped structure and further has an accommodation region 431, as shown in FIG. 5. In another embodiment, the hollow slot 43b has for example a large area passing through the third side 41 and the fourth side 42 of the second circuit board 40, as shown in FIG. 9. In the embodiment, the controlling chip 44 and the other devices of the second circuit board 40 and the conductive connection component 50 undergo a reflow soldering process, so as to preset the controlling chip 44, the conductive connection component 50 and the other devices on the third side 41 of the second circuit board 40. The present disclosure is not limited thereto. In addition, the second circuit board 40 includes at least one pin 45 disposed on the fourth side 42 and used for external electrical connection with for example but not limited to a system end or a system motherboard. Preferably but not exclusively, the at least one pin 45 is a land grid array (LGA) pin or a ball grid array (BGA) pin. The present disclosure is not limited thereto.

Moreover, in the embodiment, the first printed-circuit-board assembly 2 is a power-board assembly and the second printed-circuit-board assembly 3 is a pin-board assembly. Preferably but not exclusively, the at least one conductive connection component 50 is a copper block or a pin header. The present disclosure is not limited thereto.

Thereafter, as shown in the step S03, the second printed-circuit-board assembly 3 and other components that have undergone one reflow soldering process are stacked on the second side 12 of the first circuit board 10. The second side 12 of the first circuit board 10 faces the third side 41 of the second circuit board 40. The magnetic component 30 is disposed at a position of the first circuit board 10, which spatially corresponds to the hollow slot 43 of the second circuit board 40. In the embodiment, the second magnetic core 32 of the magnetic component 30 spatially corresponds to the hollow slot 43. The second magnetic core 32 is pre-mounted between the first circuit board 10 and the second circuit board 40. Moreover, the second magnetic core 32 of the magnetic component 30 is exposed through the at least one hollow slot 43. Since the conductive connection component 50 and the magnetic component 30 are misaligned to each other, the second magnetic core 32 can be pre-mounted between the second side 12 of the first circuit board 10 and the third side 41 of the second circuit board 40. Thereby, the bottom of the second magnetic core 32 is exposed through the at least one hollow slot 43, and the conductive connection component 50 is correspondingly disposed between the second side 12 of the first circuit board 10 and the third side 41 of the second circuit board 40 through solder.

Then, as shown in the step S04, the at least one conductive connection component 50, the first printed-circuit-board assembly 2 and the second printed-circuit-board assembly 3 are connected with each other through a reflow soldering process. At this time, the second magnetic core 32 is kept placed between the second side 12 of the first circuit board 10 and the third side 41 of the second circuit board 40, and the bottom of the second magnetic core 32 is exposed through the hollow slot 43.

Finally, as shown in the step S05, a tool passes through the hollow slot 43 and pushes against the bottom of the second magnetic core 32, and the first magnetic core 31 disposed on the first side 11 and the second magnetic core 32 disposed on the second side 12 are collaboratively combined on the first circuit board 10, to form the planar transformer required. In this way, the number of reflow soldering processes undergone by the fine component such as the power switch 20 and the driving chip 21 of the first printed-circuit-board assembly 2 is controlled within two. Moreover, the controlling chip 44 of the second printed-circuit-board assembly 2 undergoes one reflow soldering process merely. Therefore, the assembling method of the power module structure 1 of the present disclosure has the advantage of reducing the number of reflow soldering processes undergone by the fine component. Moreover, the purposes of simplifying the manufacturing process and reducing production costs are achieved at the same time. On the other hands, after undergoing the reflow soldering process described above, the magnetic component 30 pre-placed is combined on the first circuit board 10 by using a tool passing through the hollow slot 43 to push against the exposed bottom of the second magnetic core 32 of the magnetic component 30, so as to complete the assembly of the magnetic component 30 fixed on the first circuit board 10. It is helpful of increasing the flexibility of the assembly process.

Please refer to FIGS. 5 to 8 and FIG. 13. In the embodiment, the at least one hollow slot 43a includes a stepped structure and further has an accommodation region 431. The accommodation region 431 is concavely formed from the third side 41 toward the fourth side 42. Moreover, a projection area of the accommodation region 431 projected on the third side 41 is greater than a projection area of the second magnetic core 32 of the at least one magnetic component 30 projected on the third side 41. Thereby, the second magnetic core 32 of the at least one magnetic component 30 can be at least partially accommodated in the accommodation region 431. In the foregoing step S05, the tool passes through the hollow slot 43a to push against the bottom of the second magnetic core 32, to make the second magnetic core 32 to attach to the second side 12 of the first circuit board 10. In this way, the first magnetic core 31 disposed on the first side 11 and the second magnetic core 32 disposed on the second side 12 are connected through the through holes 13 of the first circuit board 10 and collaboratively combined on the first circuit board 10. Thus, the planar transformer with the required specifications is formed, and the power module structure 1a is completed. The tool can be removed after the assembly is completed. The present disclosure is not limited thereto. Similarly, the assembling method of the power module structure 1a of the present disclosure has the advantage of reducing the number of reflow soldering processes undergone by the fine component. Moreover, the purposes of simplifying the manufacturing process and reducing production costs are achieved at the same time. On the other hands, after undergoing the reflow soldering process described above, the magnetic component 30 pre-placed is combined on the first circuit board 10 by using a tool passing through the hollow slot 43a to push against the exposed bottom of the second magnetic core 32 of the magnetic component 30, so as to complete the assembly of the magnetic component 30 fixed on the first circuit board 10. It is helpful of increasing the flexibility of the assembly process. Moreover, the projection area of the accommodation region 431 projected on the third side 41 is greater than the projection area of the second magnetic core 32 of the at least one magnetic component 30 projected on the third side 41. Thereby, the second magnetic core 32 of the at least one magnetic component 30 can be at least partially accommodated in the accommodation region 431 of the hollow slot 43a, so as to reduce the height of the overall power module structure 1a and achieve the purpose of increasing power density.

Please refer to FIGS. 9 to 12 and FIG. 13. In the embodiment, the projection area of the at least one hollow slot 43b projected on the third side 41 is greater than the projection area of the second magnetic core 32 of the at least one magnetic component 30 projected on the third side 41. In the foregoing step S05, the second magnetic core 32 is capable of passing through the hollow slot 43b directly to attach to the second side 12 of the first circuit board 10. Thereby, the first magnetic core 31 disposed on the first side 11 and the second magnetic core 32 disposed on the second side 12 are connected through the through holes 13 of the first circuit board 10 and collaboratively combined on the first circuit board 10. Thus, the planar transformer with the required specifications is formed, and the power module structure 1b is completed. In the embodiment, the number of reflow soldering processes undergone by the fine component such as the power switch 20 and the driving chip 21 of the first printed-circuit-board assembly 2 is controlled within two. Moreover, the number of reflow soldering processes undergone by the controlling chip 44 of the second printed-circuit-board assembly 3 is controlled within two. Therefore, the assembling method of the power module structure 1b of the present disclosure has the advantage of reducing the number of reflow soldering processes undergone by the fine component. Moreover, the purposes of simplifying the manufacturing process and reducing production costs are achieved at the same time. On the other hands, after undergoing the reflow soldering process described above, the second magnetic core 32 of the magnetic component 30 is capable of passing through the hollow slot 43b to combine with the first magnetic core 31 disposed on the first side 11 through the through hole 13, so as to complete the assembly of the magnetic component 30 fixed on the first circuit board 10. It is helpful of increasing the flexibility of the assembly process. Moreover, since the projection area of the at least one hollow slot 43b projected on the third side 41 is greater than the projection area of the second magnetic core 32 of the at least one magnetic component 30 projected on the third side 41, the second magnetic core 32 of the at least one magnetic component 30 can be partially accommodated in the at least one hollow slot 43b, so as to reduce the height of the overall power module structure 1b and achieve the purpose of increasing power density.

In an embodiment, the power module includes a plurality of magnetic components 30, which are disposed as the foregoing embodiments. Correspondingly, the second circuit board 40 includes a plurality of hollow slots 43. The principle shown in the embodiments of the present disclosure can be used to control the number of reflow soldering processes undergone by the fine components in the power module within two.

In summary, the present disclosure provides a power module structure and an assembling method thereof. A first printed-circuit-board assembly such as a power-board assembly and a second printed-circuit-board assembly such as a pin-board assembly are assembled through at least one conductive connection component and completed by one reflow soldering process, to reduce the number of reflow soldering processes undergone by a fine component such as a power device on the power-board assembly. Moreover, the purposes of simplifying the manufacturing process and reducing production costs are achieved at the same time. On the other hand, a pin board of the pin-board assembly includes at least one hollow slot disposed thereon. The at least one hollow slot spatially corresponds to a magnetic component including an upper magnetic core and a lower magnetic core, and the conductive connection component and the magnetic component are misaligned. Moreover, the projections of the magnetic component and the hollow slot are at least partially overlapped on a plane of the pin board, so as to expose a bottom surface of the lower magnet core through the hollow slot. Thus, the magnetic component arranged on the power-board assembly is passed through the hollow slot of the pin board after one reflow soldering process, and a tool is used to push the lower magnetic core of the magnetic component through the hollow slot to complete the assembly of the magnetic component fixed to the power-board assembly. It is helpful of increasing the flexibility of the assembly process. In addition, a portion of the lower magnetic core of the magnetic component is received within the hollow slot, so as to reduce the height of the overall structure and achieve the purpose of increasing power density.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A power module structure, comprising:
a first printed-circuit-board assembly comprising a first circuit board, at least one power switch and at least one magnetic component, wherein the first circuit board comprises a first side, a second side and at least one through hole, the at least one through hole passes through the first side and the second side, and the at least one power switch is disposed on the first circuit board, wherein the at least one magnetic component comprises a first magnetic core and a second magnetic core disposed on the first side and the second side, respectively, and combined on the first circuit board through the at least one through hole;
a second printed-circuit-board assembly comprising a second circuit board, wherein the second circuit board comprises a third side, a fourth side and an accommodation region, and the third side faces the second side, wherein the accommodation region is concavely formed from the third side toward the fourth side; and
a conductive connection component disposed on the second side of the first circuit board and the third side of the second circuit board, and electrically connected to the first printed-circuit-board assembly and the second printed-circuit-board assembly, wherein the at least one conductive connection component and the at least one magnetic component are misaligned to each other.

2. The power module structure according to claim 1, wherein the at least one conductive connection component is connected between the first printed-circuit-board assembly and the second printed-circuit-board assembly.

3. The power module structure according to claim 1, further comprising at least one opening, wherein the at least one opening passes through the third side and the fourth side, and spatially corresponds to the second magnetic core of the at least one magnetic component, and the second magnetic core of the at least one magnetic component is partially exposed through the at least one opening, wherein a projection area of the at least one opening projected on the third side and a projection area of the second magnetic core of the at least one magnetic component projected on the third side are at least partially overlapped.

4. The power module structure according to claim 1, wherein a projection area of the at least one opening projected on the third side is greater than 0.2 mm².

5. The power module structure according to claim 1, wherein the accommodation region is spatially corresponding to the second magnetic core of the at least one magnetic component, wherein a projection area of the accommodation region projected on the third side is greater than a projection area of the second magnetic core of the at least one magnetic component projected on the third side, and the second magnetic core of the at least one magnetic component is at least partially accommodated in the accommodation region.

6. The power module structure according to claim 3, wherein a projection area of the accommodation region projected on the third side is greater than a projection area of the second magnetic core of the at least one magnetic component projected on the third side, and the second magnetic core of the at least one magnetic component is at least partially accommodated in the accommodation region.

7. The power module structure according to claim 1, wherein the at least one conductive connection component is one selected from the group consisting of a copper block and a pin header.

8. The power module structure according to claim 1, wherein the at least one magnetic component is a planar transformer.

9. The power module structure according to claim 1, wherein the second circuit board comprises at least one pin disposed on the fourth side and used for external electrical connection.

10. The power module structure according to claim 9, wherein the at least one pin is one selected from the group consisting of a land grid array pin and a ball grid array pin.

11. The power module structure according to claim 1, wherein the first printed-circuit-board assembly comprises at least one driving chip disposed on the first side or the second side of the first circuit board.

12. The power module structure according to claim 1, wherein the second printed-circuit-board assembly comprises at least one controlling chip disposed on the third side of the second circuit board.

13. The power module structure according to claim 1, wherein the at least one opening is used for operating a tool to assemble the magnetic component.

14. The power module structure according to claim 1, wherein the at least one opening has a shape selected from the group consisting of a circle, a rectangle, a square and an ellipse.

* * * * *